US008293438B2

(12) United States Patent
Iftime et al.

(10) Patent No.: US 8,293,438 B2
(45) Date of Patent: Oct. 23, 2012

(54) ERASABLE MEDIA WITH BINDER

(75) Inventors: Gabriel Iftime, Mississauga (CA); Kentaro Morimitsu, Mississauga (CA); Peter M. Kazmaier, Mississauga (CA); Adela Goredema, Mississauga (CA); Hadi K. Mahabadi, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 463 days.

(21) Appl. No.: 12/627,882

(22) Filed: Nov. 30, 2009

(65) Prior Publication Data

US 2011/0130279 A1 Jun. 2, 2011

(51) Int. Cl.
*G03F 7/00* (2006.01)
*G03F 7/20* (2006.01)

(52) U.S. Cl. ........................ 430/19; 430/270.1; 430/905

(58) Field of Classification Search .................... 430/19, 430/270.1, 905
See application file for complete search history.

(56) References Cited

U.S. PATENT DOCUMENTS

| | | | | |
|---|---|---|---|---|
| 4,026,869 | A * | 5/1977 | Evens et al. | 528/185 |
| 6,479,604 | B1 * | 11/2002 | Kim et al. | 526/242 |
| 7,247,262 | B2 * | 7/2007 | Evans et al. | 252/586 |
| 7,666,558 | B2 * | 2/2010 | Iftime et al. | 430/19 |
| 2008/0311491 | A1 * | 12/2008 | Iftime et al. | 430/19 |
| 2010/0227760 | A1 * | 9/2010 | Morimitsu et al. | 503/201 |
| 2011/0082035 | A1 * | 4/2011 | Morimitsu et al. | 503/201 |
| 2011/0092364 | A1 * | 4/2011 | Morimitsu et al. | 503/201 |
| 2011/0215283 | A1 * | 9/2011 | Morimitsu et al. | 252/586 |

FOREIGN PATENT DOCUMENTS

EP 2003496 A1 * 12/2008

* cited by examiner

*Primary Examiner* — Amanda C. Walke
(74) *Attorney, Agent, or Firm* — MH2 Technology Law Group LLP

(57) ABSTRACT

Exemplary embodiments provide compositions and methods for an erasable medium that can include a photochromic composite containing a photochromic polymer dispersed in a polymer binder, a similar type polymer of a backbone portion of the photochromic polymer.

19 Claims, 4 Drawing Sheets

ERASABLE MEDIA WITH BINDER

DETAILED DESCRIPTION

1. Field of Use

The present teachings relate generally to erasable media and, more particularly, to erasable media having a binder material similar to a backbone portion of a photochromic polymer.

2. Background

A known method for producing erasable media involves coating a paper substrate with a coating composition made of a photochromic material and a polymer binder in a solvent. The binder increases viscosity of the coating composition. A higher viscosity provides a thicker coating, which increases the amount of photochromic material per surface unit. An increased amount of photochromic material in the coating composition is desired for initial writability of the erasable media.

Conventional polymer binders such as polymethyl methacrylate (PMMA) are used in combination with photochromic monomers such as spiropyrans to form erasable media. As a result, visible images written on conventional erasable media are readable for a few hours under ambient light conditions, and are often self-erased with no effort from the user. In most cases, the self-erased erasable media are ready to be imaged again within about a day.

It is desirable, however, for the erasable media to have a longer image lifetime as well as an acceptable initial writability. For example, it would be desirable for an erasable medium to be readable for as long as required by the user, then erased on demand and available for subsequent re-imaging.

Thus, there is a need to overcome these and other problems of the prior art and to provide erasable media with increased writability, longer image lifetime, and/or higher reusability as compared with conventional erasable media.

SUMMARY

According to various embodiments, the present teachings include a photochromic composite that contains a photochromic polymer and a polymer binder. The photochromic polymer can have a glass transition temperature ranging from about 30° C. to about 150° C. and can include a photochromic moiety covalently bound to a backbone portion. The backbone portion and the polymer binder can be similar type polymers having at least one similar functional group. In embodiments, the photochromic composite can be imageable and can be disposed over a substrate to form an erasable medium.

According to various embodiments, the present teachings also include a method for making an erasable medium. Specifically, a photochromic polymer that includes a photochromic moiety covalently bound to a backbone portion can first be provided having a glass transition temperature ranging from about 30° C. to about 150° C. A polymer binder that is a similar type polymer to the polymer backbone of the photochromic polymer can then be mixed with the photochromic polymer to prepare a composition. The composition can further be applied to a substrate and dried to form a photochromic layer on the substrate.

According to various embodiments, the present teachings further include a method of forming an erasable image. An erasable medium that includes a photochromic layer disposed on a substrate can be provided to form an erasable image. The photochromic layer can further include a photochromic polymer dispersed in a polymer binder. The photochromic polymer can include a photochromic moiety covalently bound to a backbone portion. The backbone portion of the photochromic polymer can be a similar type polymer to the polymer binder of the photochromic layer. To form an erasable image, the photochromic layer of the erasable medium can be exposed to both a radiant energy and a temperature ranging from about 30° C. to about 100° C. A visible image can thus be formed on/in the erasable medium.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate several embodiments of the present teachings and together with the description, serve to explain the principles of the present teachings.

It should be noted that some details of the figures have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. Wherever possible, the same reference numbers will be used throughout the drawings to refer to the same or like parts.

In the following description, reference is made to the accompanying drawings that form a part thereof, and which are shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

Exemplary embodiments provide compositions and methods for an erasable medium that includes a photochromic layer over a substrate. The photochromic layer can include a photochromic composite. In embodiments, the photochromic composite can include a photochromic polymer dispersed in a polymer binder. The photochromic polymer can include at least one photochromic moiety covalently bound to a backbone portion. The backbone portion can include, for example, a non-photochromic polymer. In embodiments, the polymer binder and the backbone portion of the photochromic polymer can be similar type polymers having at least one similar functional group.

Figure 1A:
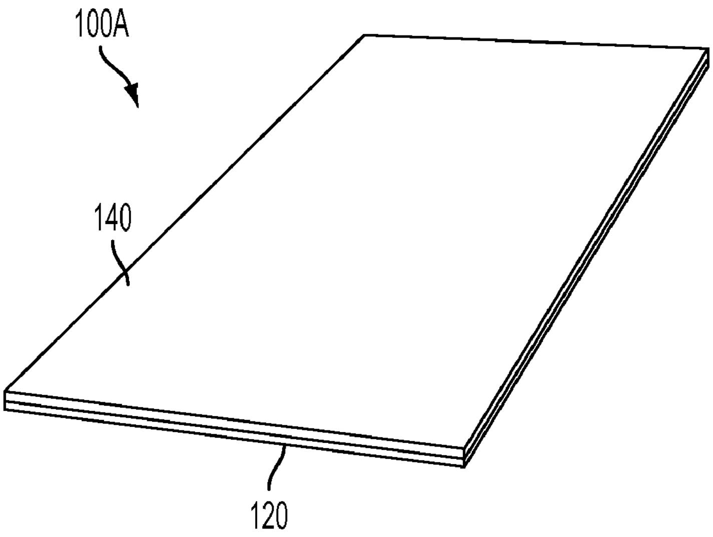
FIG. 1A depicts an exemplary erasable medium in accordance with various embodiments of the present teachings.

FIG. 1A depicts an exemplary erasable medium 100A in accordance with various embodiments of the present teachings. It should be readily apparent to one of ordinary skill in the art that the medium 100A depicted in FIG. 1A represents a generalized schematic illustration and that other components can be added or existing components can be removed or modified.

As shown, the medium 100A can include a substrate 120 and a photochromic layer 140 disposed over the substrate 120.

In various embodiments, the substrate 120 can be made of a flexible or a rigid material and can be transparent or opaque. The substrate 120 can include, for example, any suitable material such as paper, wood, glass, ceramics, plastics, fabrics, textile products, polymeric films, inorganic substrates such as metals, and the like. The paper can include, for example, plain papers such as XEROX® 4024 papers, ruled notebook paper, bond paper, silica coated papers such as Sharp Company silica coated paper, Jujo paper, and the like. The plastic can include clear, translucent, or opaque plastics, for example, a plastic film made of polyethylene, polyethylene terepthalate, polyethylene naphthalate, polystyrene, polycarbonate, or polyethersulfone. The substrate 120, such as a sheet of paper, can have a blank appearance.

In various embodiments, the substrate 120 can be a single layer or multi-layer where each layer is the same or different material and can have a thickness, for example, ranging from about 0.3 mm to about 5 mm.

The photochromic layer 140 can be impregnated, embedded or coated to the substrate 120, for example, a porous substrate such as paper. In various embodiments, the photochromic layer 140 can be applied uniformly to the substrate 120 and/or fused, or otherwise permanently affixed thereto.

Figure 1B:
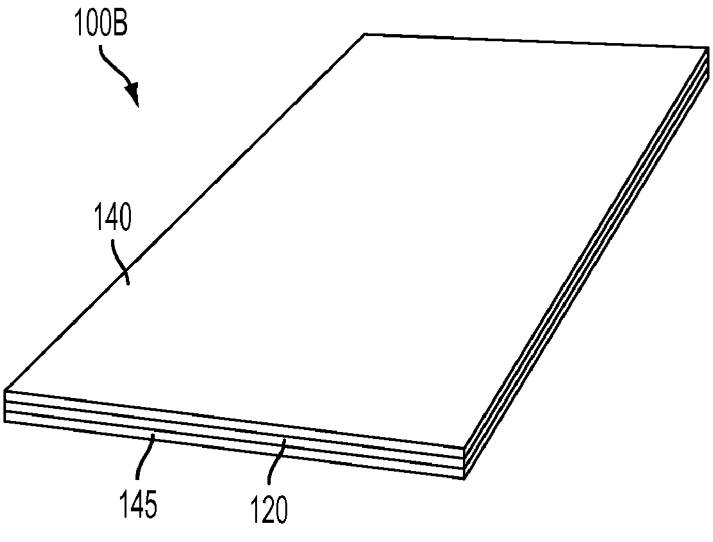
FIG. 1B depicts another exemplary erasable medium in accordance with various embodiments of the present teachings.

FIG. 1B shows another exemplary erasable medium 100B in accordance with various embodiments of the present teachings. As compared with the erasable medium 100A, the erasable medium 100B can further include a second photochromic layer 145 disposed over the substrate 120 on a side opposite to the photochromic layer 140. In various embodiments, the second photochromic layer 145 and the photochromic layer 140 can be the same or different.

The photochromic layer 140, 145 can include, for example, a photochromic composite. In embodiments, the photochromic composite can include a photochromic polymer dispersed in a polymer binder. In embodiments, the photochromic polymer and its formation method can include those disclosed in co-pending U.S. patent application Ser. No. 12/400,276, filed Mar. 9, 2009, and entitled "Reimageable and Reusable Medium and Method of Producing and Using the Reimageable and Reusable Medium", the disclosure of which is incorporated herein by reference in its entirety.

As shown in the following Formula I, the photochromic polymer can include at least one photochromic moiety covalently bound to a backbone portion.

Formula I $$-\left[\text{Backbone Portion}\right]_n\left[\text{Photochromic Moiety}\right]_m-$$

In Formula I, the backbone portion can be present in an amount ranging from 0 to about 95%, or ranging from 10% to about 90%, or ranging from 10% to about 50% by weight of the total photochromic polymer of Formula I with n ranging from 0 to about 1000. Still in Formula I, the photochromic moiety can be present in an amount ranging from about 0.1% to about 100%, or ranging from 10% to about 90%, or ranging from 10% to about 50% by weight of the total photochromic polymer of Formula I with m ranging from 1 to about 1000.

In embodiments, the photochromic moiety can include one or more photochromic molecules or compounds bound to the backbone portion within its polymer chain. In embodiments, the photochromic moiety can be introduced into the polymer chain of the backbone portion by, for example including the photochromic molecules or compounds during the preparation process of the backbone portion, such as in the form of reactive units, monomer units, or the like. Alternatively, the photochromic moiety can be added to an already formed backbone portion through known chemical functionalization reactions.

In various embodiments, where multiple types of photochromic moiety are present in the polymer chain of the backbone portion, the multiple types of photochromic moiety can be the same or different in the photochromic polymer of Formula I.

In various embodiments, the photochromic layer 140 or 145 of FIGS. 1A-1B can include only one type of photochromic polymer of Formula I. In other embodiments, the photochromic layer 140 or 145 can include a mixture of two or more different types of photochromic polymers of Formula I, for example, different photochromic polymers having different types of photochromic moieties in the polymer chain, or the same or different types of photochromic moieties in different polymer chains of the backbone portion.

Because the photochromic polymer of Formula I is converted between its colored and colorless states in response to radiant energy and/or heat, the backbone portion and the photochromic moiety can be desirably selected such that the photochromic polymer of Formula I has thermal properties that can withstand, for example, temperatures at which images can be formed or erased. For example, the photochromic polymer of Formula I can be selected to have a glass transition temperature ranging from about 30° C. to about 150° C., or from about 30° C. to about 100° C., or further from about 55° C. to 80° C. Within the glass transition temperature range, the erasable medium 100A, 100B of FIGS. 1A-1B can convert to a colored state. Further, within the glass transition temperature range, the photochromic polymer can soften to allow the photochromic molecules or compounds to convert to their imaging state. The image can become fixed when the temperature is reduced and the polymer rehardens.

In embodiments, the suitable photochromic moiety can include various photochromic molecules, compounds or monomers, for example, spiropyrans, diethienylethenes, naphthopyrans, chromenes, fulgides, and the like, and mixtures thereof. In embodiments, the photochromic moiety can be easily rearranged in the photochromic polymer to alter the imaging state when exposed to suitable irradiation and heat, but more difficult to rearrange in the photochromic polymer to alter the imaging state when heat is removed. One example of a suitable photochromic moiety can include a monomer having the following Formula II.

Formula II

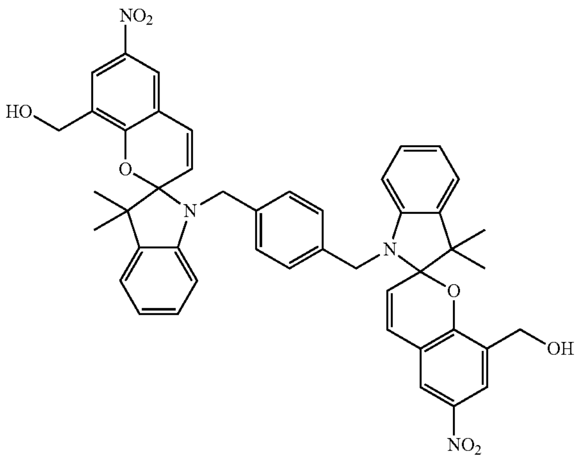

In embodiments, any suitable non-photochromic polymer material can be selected for forming the non-photochromic part of the photochromic polymer of Formula I, i.e., the backbone portion.

Referring back to FIGS. 1A-1B, the photochromic layer 140, 145 can also include a polymer binder mixed with the photochromic polymer of Formula I. In embodiments, the polymer binder can form a polymer matrix to disperse the photochromic polymer, wherein, in embodiments, the polymer binder is selected to be a "similar type polymer" of the backbone portion of the photochromic polymer of Formula I.

As used herein, the term "similar type polymers" refers to polymers which differ only in molecular weight, and/or polymers which may differ in chemical formulation but fall into the same general class of chemical compounds. In embodiments, "similar type polymers" can include one or more "similar functional groups" for the same general class of chemical compounds. In embodiments, the term "similar type polymers" can also encompass polymers that are the same, i.e., having a similarity of about 100%.

In embodiments, "similar type polymers" can be determined by "similar functional groups" between polymers. As disclosed herein, "similar functional groups" can differ in molecular weight and may be used to determine the general class of similar type polymers. For example, various acrylics, methacrylics and acrylic (methacrylic) copolymers can all be similar type polymers due to the similar or common functional acrylic group. Also, all polyesters can be similar type polymers, although they are not similar to polystyrenes. In embodiments, "similar functional groups" can provide similarity for similar type polymers in any of chemical function, synthetic method, and/or polymer property. In embodiments, similar functional groups can have a similarity of about 100%.

In various embodiments, the polymer binder and the backbone portion of the photochromic polymer of Formula I can be similar type polymers having one or more similar functional groups. In various embodiments, the structure of the polymer binder and of the backbone portion of the photochromic polymer can be defined as polymers resulted from a polycondensation reaction between two different monomers, wherein the first reacting monomer can include, for example, a diacid or diacyl chloride and the second reacting monomer can include, for example, a diol.

For example, the polymer binder and/or the backbone portion of the photochromic polymer can include a reaction product from a first monomer and a second monomer.

In embodiments, the first monomer can include, but is not limited to, diacyl chlorides, diacids, its dimethyl esters, or its cyclic esters such as oxalyl, malonyl, succinyl, glutaryl, adipoyl, pimeloyl, suberoyl, azelaoyl, sebacoyl, fumaryl, terephthalic, isophthalic, phthalic, and mixtures thereof. In embodiments, the first monomer can also include a connecting portion which chemically bonds the diacyl chlorides, diacids or its dimethyl ester functions. The connecting portion of the first monomer can include, for example, a hydrocarbon group that is a straight, branched or cyclic, saturated or unsaturated, substituted or unsubstituted, from 1 to about 40 carbon atoms, or a substituted or unsubstituted aromatic. Additionally, the connecting portion of the first monomer can also include heteroaromatic groups.

In embodiments, the second monomer can include, but is not limited to, bisphenols, diols including bis-phenol A, bisphenol B, bisphenol C, bisphenol F, bisphenol M, bisphenol P, bisphenol AP, bisphenol Z, ethylene glycol, propylene glycol, butylene glycol, pentylene glycol, hexylene glycol, heptylene glycol, diethylene glycol, dipropylene glycol, cyclohexyldimethanol, bisphenol A ethoxylate, or bisphenol A propoxylate, and mixtures thereof. In embodiments, the second monomer can also include a connecting portion which chemically bonds two hydroxyl groups. The connecting portion of the second monomer can include, for example, a hydrocarbon group that is a straight, branched or cyclic, saturated or unsaturated, substituted or unsubstituted, from 1 to about 40 carbon atoms, or a substituted or unsubstituted aromatic. Additionally, the connection portion of the second monomer can also include heteroaromatic groups.

In embodiments, the similar functional groups for similar type polymers of the polymer binder and the backbone portion can include similar hydrocarbon or heteroaromatic connecting portions having straight, branched or cyclic, saturated or unsaturated, substituted or unsubstituted having from about 1 to about 40 carbon atoms and/or having a substituted or unsubstituted aromatic or heteroaromatic group.

In embodiments, the hydrocarbon portion can include homologous series with a general formula of $C_nH_{2n}$, where n is the number of carbon atoms. In embodiments, the $C_nH_{2n}$ moiety can be a backbone for the disclosed hydrocarbon portion of the similar functional groups.

In embodiments, the hydrocarbon or heteroaromatic connecting portion of the homologous series of photochromic polymer and the polymer binder can have the same of or a different number of carbon atoms or heteroatoms. For example, a polymer binder having a hydrocarbon chain of about 4 carbons can work with a photochromic polymer having a hydrocarbon chain made of about 5 carbon atoms.

In various embodiments, one particular example of a suitable photochromic polymer of Formula I, formed from polymer backbone and photochromic moiety, can be a photochromic polymer having the following general Formula III.

Formula III

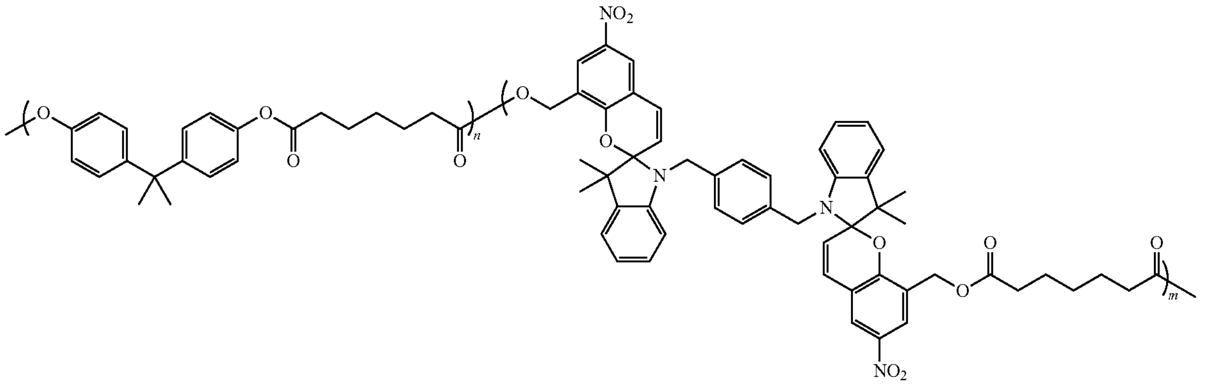

In Formula III, m can range from about 1 to about 1000, and n can range from 0 to about 1000, although other ranges for m and n can be used, for example, as indicated by Formula I. As shown, an exemplary backbone portion of Formula III can have the following general formula IV.

Formula IV

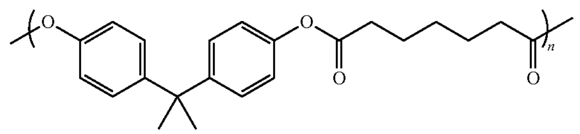

In various exemplary embodiments, when the photochromic polymer of Formula III is used, the polymer binder can be selected to be essentially a polyester-type polymer similar to the backbone portion of Formula IV.

For example, Formula V shows an exemplary polymer binder selected to be combined with the photochromic polymer of Formula III to form an exemplary photochromic composite for the photochromic layer 140, 145.

Formula V

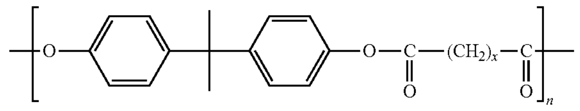

In Formula V, x can range from 0 to about 10. For example, x can be an integer ranging from 1 to about 10, or ranging from about 3 to about 6. As disclosed herein, the exemplary backbone portion of Formula IV and the exemplary polymer binder of Formula V can be of "similar type polymers", regardless of the value of x in Formula V.

In embodiments, the selection of the polymer binder as a similar type polymer of the backbone portion of the photochromic polymer of Formula I can provide longer lifetimes of written images. Specifically, a color contrast between the image and background areas of the erasable medium can be maintained for longer than conventional erasable media. In addition, the disclosed combination of the polymer binder with the photochromic polymer for the photochromic layer 140, 145 of FIGS. 1A-1B can provide for better writability and increased reusability of the erasable medium 100A, 100B as compared with conventional erasable media.

In embodiments, the photochromic composite or the photochromic layer 140, 145 of FIGS. 1A-1B can include the polymer binder and the photochromic polymer in any suitable amounts. For example, the polymer binder can be present in an amount of from about 0.01 to about 99.5 percent by weight of the total photochromic composite or the photochromic layer 140, 145. In another example, the polymer binder can be present in an amount of from about 30 to about 90 percent or from about 40 to about 80 percent by weight of the total photochromic composite or the photochromic layer 140, 145.

In embodiments, the photochromic polymer of Formula I, including photochromic moiety covalently bound to backbone portion, can be present in an amount of from about 0.05 to about 100 percent by weight of the total photochromic composite or the photochromic layer 140, 145. In another example, the photochromic polymer of Formula I can be present in an amount of from about 0.1 to about 70 percent or from about 1 to about 60 percent by weight of the total photochromic composite or the photochromic layer 140, 145.

In embodiments, the photochromic composite or the photochromic layer 140, 145 can be formed by applying a composition to the substrate 120 of FIGS. 1A-1B. For example, the composition can be formed by dispersing the photochromic polymer of Formula I and the polymer binder in a solvent. In other embodiments, the liquid composition can be formed by mixing a solution that contains the polymer binder with the photochromic polymer of Formula I in the presence of a solvent.

The composition can then be applied to or impregnated into at least one side of the substrate 120. The solvent can be subsequently evaporated, hardened, or dried to form a dry layer as the photochromic composite or the photochromic layer 140, 145. In embodiments, the erasable medium 100A, 100B can also be referred to as a coated substrate.

In embodiments where the composition is coated on or impregnated into the substrate, the coating can be applied by any suitable methods known in the art. For example, a printing or a coating method can be used to apply the composition to the substrate. Exemplary printing methods can include inkjet printing, lithographic or offset printing, flexographic printing, screen printing, stencil printing, stamping, microcontact printing, gravure, and the like. Exemplary coating methods can include spin coating, blade coating, rod coating, dip coating, and the like.

In embodiments, an overcoat layer can be applied over the dried photochromic layer 140, 145 described above. The overcoat layer can be applied, for example, to further adhere the underlying layer to the substrate, to provide wear resistance, and to improve the appearance and feel of the erasable medium 100. The overcoat layer can be the same as or different from the substrate material, although in embodiments at least one of the overcoat layer and substrate layer can be clear and transparent to permit visualization of the image to be formed. The overcoat layer can have a thickness of, for example, from about 0.001 mm to about 10 mm, or from about 0.1 mm to about 5 mm or further from about 1 mm to about 4 mm, although other thicknesses can be used. For example, the coated substrate can be laminated between supporting sheets such as plastic sheets. In embodiments, the overcoat layer can be applied using a method similar to the liquid composition used to form the photochromic layer 140, 145.

In embodiments, the photochromic properties of the photochromic moiety covalently bound within the backbone portion can be dictated by the thermal properties of the photochromic polymer of Formula I.

In embodiments, the photochromic polymer, including the photochromic moiety bound to the backbone portion, can have a glass transition temperature ranging from about 30° C. to about 150° C., or from about 30° C. to about 100° C., or further from about 55° C. to about 80° C. The coated substrate or the erasable medium 100A, 100B that includes the photochromic polymer dispersed in the polymer binder can convert to a colored state when both radiant energy such as UV light and temperatures ranging from about 30° C. to about 100° C. or to about 150° C. are applied to the erasable medium 100.

The disclosed erasable media can be imaged at or above the disclosed glass transition temperature to achieve maximum optical density. By tuning the glass transition temperature (Tg) of the photochromic polymer, the photochromic composite or the photochromic layer 140, 145 can be made to have an extended lifetime for the colored (or imaged) state with little reduction in color contrast relative to the background areas. Therefore, various embodiments can provide an erasable medium that eliminates the need for a protective yellow film (or dye-based top coating). The yellow film is often applied on conventional erasable media containing spiropyran monomers. Although the yellow film provides protection, it also creates imaging problems including low optical densities during writing and adds additional costs and processes. The disclosed erasable medium 100A, 100B can provide better reusability and initial writability having a high optical density as compared with conventional erasable media.

According to present teachings, writing an image can be conducted by applying a first stimulus, for example radiant energy and/or heat to the erasable medium 100. The stimulus can provide a specific range of temperatures and/or wavelengths to the photochromic layer 140, 145 to cause a color change. An exemplary temperature range for the writing process can be from about 30° C. to about 150° C., or from about 30° C. to about 100° C., or further from about 55° C. to about 80° C. Erasing can be conducted by applying a second, different stimulus, for example applying heat at elevated temperatures to the photochromic layer 140, 145 to reverse the color change in a short time period. An exemplary temperature range for the erasing process can be about 70° C. or above, for example, ranging from about 80° C. to about 200° C. or from about 90° C. to about 100° C.

Various embodiments can also include a method for writing on and erasing the disclosed erasable medium. For example, a transient image can be written in or on the photochromic layer 140, 145 of the erasable medium 100A, 100B and can then be erased from the imaged erasable medium. In embodiments, the erasable medium can be reused to undergo a number of cycles of temporary image formation and temporary image erasure. For example, the erasable medium can be reused at least about 10 times, or at least about 30 times, or at least about 50 times.

Figure 2:
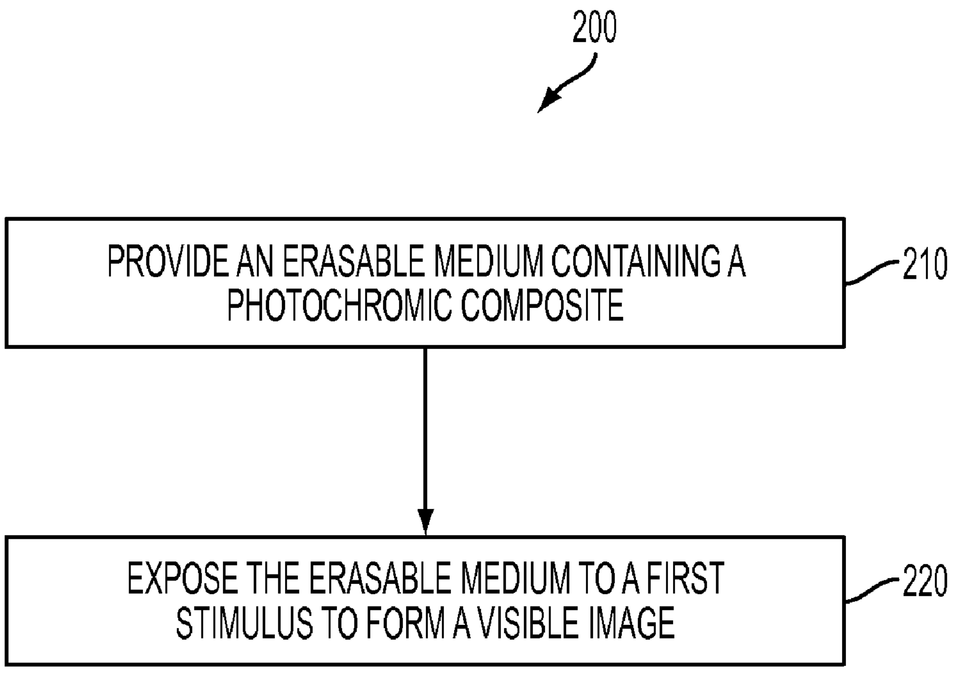
FIG. 2 depicts an exemplary method for using an erasable medium in accordance with various embodiments of the present teachings.

FIG. 2 depicts an exemplary method 200 for using the disclosed erasable medium in accordance with various embodiments of the present teachings.

At 210, an erasable medium can be provided or formed as disclosed herein. For example, the erasable medium can include a photochromic layer either coated on or impregnated into a substrate. The photochromic layer can include a photochromic coating composite including a photochromic polymer mixed with a polymer binder. The polymer binder can be a similar type polymer as that of a backbone portion of the photochromic polymer that further includes one or more photochromic moieties covalently bound to the backbone portion.

At 220, the erasable medium can be exposed to a first stimulus, e.g., a writing stimulus, in an image-wise manner to form a visible image. The first stimulus for writing can be, for example, both a radiant energy such as a UV light and a temperature ranging from about 30° C. to about 150° C.

The radiant energy for writing can have any suitable predetermined wavelength, for example, a single wavelength or a band of wavelengths. In various exemplary embodiments, the radiant energy for writing, for example an ultraviolet (UV) light, can have a single wavelength or a narrow band of wavelengths selected from the UV light wavelength range of about 10 nm to about 475 mm, such as a single wavelength from about 200 nm to about 475 nm, or from about 350 nm to about 370 nm or about 365 nm. For each imaging, the erasable medium can be exposed to the radiant energy for a time period ranging from about 10 milliseconds to about 5 minutes, or from about 30 milliseconds to about 4 minutes, or from about 50 milliseconds to about 1 minute. The exemplary UV light can have an intensity ranging from about 0.1 $mW/cm^2$ to about 100 $mW/cm^2$, or from about 0.5 $mW/cm^2$ to about 10 $mW/cm^2$, or from about 1 $mW/cm^2$ to about 5 $mW/cm^2$.

In various exemplary embodiments, UV light corresponding to the image can be generated by a radiant source, for example, by a LED (light emitting diode) array screen and the image can be formed on the erasable medium by placing the medium on the LED screen for the period of time. In other exemplary embodiments, a UV raster output scanner (ROS) or a UV laser diode (LD) can be used to generate the UV light to sensitize the photochromic polymer from a colorless state to a colored state.

According to various exemplary implementations, the color contrast that renders the image visible to an observer can be a contrast between, for example two, three or more different colors. The term "color" can encompass a number of aspects such as hue, lightness and saturation, where one color may be different from another color if the two colors differ in at least one aspect. For example, two colors having the same hue and saturation but different in lightness can be considered different colors. Any suitable colors, for example, red, white, black, gray, yellow and purple, can be used to produce a color contrast as long as the image is visible to the naked eye of a user. In various exemplary embodiments, the following exemplary color contrasts can be used: purple image on a white background; yellow image on a white background; dark purple image on a light purple background; or light purple image on a dark purple background.

In embodiments, optical density (OD) can be used to characterize erasable media and the formed images. Optical density (OD) can be measured as known to one of ordinary skill in the art after a certain period of time from the application of the first stimulus for writing. Optical density difference ΔOD can then be determined by the difference between the optical density of the formed image $OD_{image}$ and the optical density of the background areas $OD_{background}$. ΔOD can thus be used to characterize color contrast between the image and the background areas. The initial optical density difference ΔOD ($\Delta OD_{t=0}$) between the image and the surrounding background areas upon the application of the first stimulus for writing can be used to characterize initial writability of the erasable medium 100. In addition, ΔOD can be used to characterize image lifetime, image readability, as well as reusability of the erasable media.

In embodiments, use of the disclosed photochromic/binder combination can provide images on the erasable media with a long lifetime and a long readability. In embodiments, the disclosed erasable medium can have reduced background coloration to further extend the lifetime of the color contrast between the formed or written image and the background areas.

As disclosed herein, the term "lifetime" refers to an amount of time required for the photochromic polymer in a colored state to fully revert or transition back to the colorless state in an ambient condition, or to change the color contrast to the absence of color contrast between the image and the background areas.

As used herein, the term "ambient condition" refers to atypical indoor ambient environment including a light condition that has a light wavelength ranging from about 380 nm to about 750 nm at room temperature ranging from about 20° C. (68° F.) to about 28° C. (82° F.).

In embodiments, the color contrast of the image formed in/on the erasable medium can be maintained for a period of time so as to be readable or recognized by an observer under an ambient condition, even though the color contrast may change, for example, it can diminish during the visible time.

As used herein, the term "readability" or "visibility" of an image encompasses any degree of color contrast, between the image formed in/on the disclosed photochromic layer of erasable media and the surrounding background areas, sufficient to render the image discernable to an observer or user, regardless of whether the color contrast changes or is constant during the visible time.

In embodiments, the "readability" for an image formed in/on the disclosed photochromic layer can be determined by a ΔOD value between the image ($OD_{image}$) and the surrounding background areas ($OD_{background}$). For example, the image formed in/on the disclosed photochromic layer can be "readable" and have a ΔOD value of about 0.05 or more. In embodiments, the formed image can be "readable" having a ΔOD value about 0.1 or more, including about 0.2 or more.

In various embodiments, the image written in/on the disclosed photochromic layer can be "readable" under ambient conditions for a period of time of at least about one day (24 hours), or at least about five days. In some embodiments, the readability of the image formed can be maintained for a period of time of at least about one week, or at least about two weeks, or at least about three weeks. In other embodiments, the color contrast of the formed image in/on the erasable medium can be maintained or readable for at least about one month, or at least about two months, or at least about 3 months.

In addition to providing long image lifetime and long image readability, use of the disclosed photochromic/binder combination can enable the erasable media to have good writability and reusability. For example, the disclosed erasable medium can have an initial ΔOD of at least about 0.75, or in embodiments at least about 0.8, or further at least about 0.9, indicating an increased initial writability of the disclosed photochromic layer 140, 145. In embodiments, the disclosed erasable medium can maintain at least about 30% of initial image quality (initial ΔOD) after 3 days, or at least about 50% or at least about 60% of the initial image quality (initial ΔOD) after 3 days. Further, the disclosed erasable medium can be re-used at least about 10 times, or in embodiments, at least about 50 times, or at least about 100 times.

In various embodiments, the erasable medium bearing the image, i.e., the imaged erasable medium, can be erased by removing color contrast between a non-exposed region and an exposed region by the first stimulus for writing the image performed at step 220 of FIG. 2.

In various exemplary embodiments, erasure of the image can occur by any of the following: (i) changing the color of the region exposed to the writing stimulus to the color of the region not exposed to the writing stimulus; (ii) changing the color of the non-exposed region to the color of the exposed region; or (iii) changing the color of the exposed region and the color of the non-exposed region to the same color different from both the exposed region color and the non-exposed region color.

In one embodiment, the imaged erasable medium can be erased by applying an erasing stimulus including, for example, heat and/or an erasing irradiation at a wavelength of visible light. In embodiments, the imaged erasable medium can be erased in an erase-on-demand manner. For example, the imaged erasable medium can be selectively exposed to heat. The exposed region for erasure can, for example, change from the colored state to the colorless state at a temperature of about 70° C. or above by a radiant energy source or a heat source, such as infrared (IR) irradiation generating heat, a hotplate, or the like. In embodiments, the temperature used for erasing can be at least about 70° C., for example, ranging from about 80° C. to about 200° C., or from about 90° C. to about 100° C.

In various embodiments for reusing the disclosed erasable medium, the step 220 of exposing the erasable medium to the first stimulus for writing can be performed at least one additional time.

The following examples are illustrative of various embodiments and their advantageous properties, and are not to be taken as limiting the disclosure or claims in any way.

EXAMPLE

Example 1

Selection and Preparation of Polymer Binders

Figure 3:
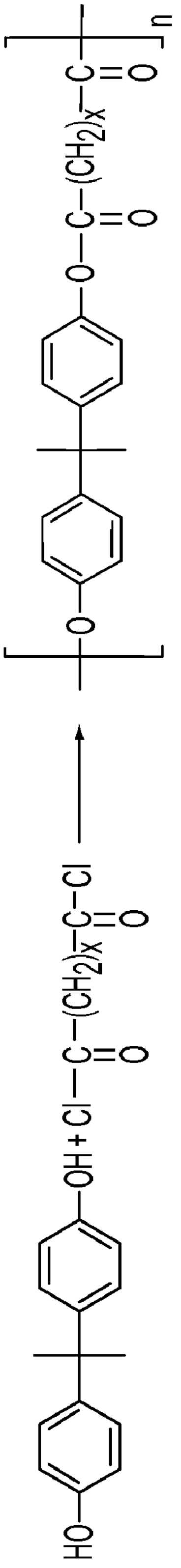
FIG. 3 depicts preparation processes for exemplary polymer binders in accordance with various embodiments of the present teachings.

Polymers C7B and C6B were selected as exemplary polymer binders. FIG. 3 shows preparation of the polymer binders C7B and C6B from a reaction between an exemplary first monomer and an exemplary second monomer as disclosed herein. For the alkyl portion $(CH_2)_x$ of the exemplary polymer binders of FIG. 3, x can be an integer of at least 1. For example, when x is 4, the product polymer is C6B; and when x is 5, the product polymer is C7B.

Specifically, polymer C7B was synthesized by slow addition of pimeloyl chloride into a bisphenol A solution in dichloromethane in the presence of triethylamine. The resulting polymer was precipitated in hexane and dried under reduced pressure.

In a particular experiment, about 81 g of bisphenol-A and about 100 ml of triethylamine were dissolved in about 860 ml of dichloromethane (DCM) and the solution was cooled with an ice bath. About 70 g of pimeloyl chloride in about 140 ml of DCM was then slowly added and the reaction mixture was stirred at room temperature for about 2 hours. The reaction mixture was washed with water and dried over magnesium sulfate. After the solvent was distilled off, the concentrated solution was precipitated in hexane to obtain BPA-C7 binder polymer.

C6B was synthesized by a similar procedure to SP-10%-C7 and also as described in co-pending U.S. patent application Ser. No. 12/400,276, filed Mar. 9, 2009, and entitled "Reimageable and Reusable Medium and Method of Producing and Using the Reimageable and Reusable Medium", the disclosure of which is incorporated herein by reference in its entirety.

Example 2

Writability of Erasable Media

Erasable media were prepared by coating conventional paper with liquid compositions containing a polymer binder of C6B or C7B and a photochromic polymer of SP-C6 or SP-C7. The photochromic polymer SP-C6 or SP-C7 included photochromic moiety of spiropyrans (SP) covalently bound to the backbone portion of C7B or C6B, where SP-C6 had a shorter hydrocarbon chain by one carbon in the monomer unit than SP-C7.

Writing was performed by exposure to about 365 nm UV light from an LED, while simultaneously heating the sample at about 70° C.

The coated erasable media were then tested and the results are summarized in Table 1.

TABLE 1

| Photochromic Polymer | | Binder | | ΔOD | ΔOD | % of initial |
|---|---|---|---|---|---|---|
| Type | Tg (° C.) | Type | Tg (° C.) | (0) | (3 days) | ΔOD (3 days) |
| SP-C6 | 36 | C6B | 58 | 0.6 | 0.34 | 57% |
| SP-C7 | 55 | C7B | 52 | 0.9 | 0.6 | 67% |
| SP-C6 | 36 | C7B | 52 | 0.71 | 0.4 | 56% |
| SP-C7 | 55 | C6B | 58 | 0.81 | 0.43 | 53% |

Table 1 shows that, after 3 days, all samples maintain over 50% of the initial image quality (initial ΔOD). Optical density was measured using Spectrolino Spectrophotometer from GretagMacbeth (New Windsor, N.Y.) with Color Quality Lite (version 3.6) software.

Comparison in Table 1 shows that the number of carbon atoms of the polymer binder and the backbone portion of photochromic polymer can be different without resulting in loss of ΔOD. For example, polymer binder C6B worked with C7-containing photochromic polymer to provide about 53% writability of the initial image after 3 days of color fading in room light (e.g., about 400 lux). That is, the similarity between the polymeric binder and the backbone portion of the photochromic polymer was the key to achieving good writability and image lifetime longer than 3 days for the exemplary erasable media.

Example 3

Reusability of Erasable Media

Figure 4:
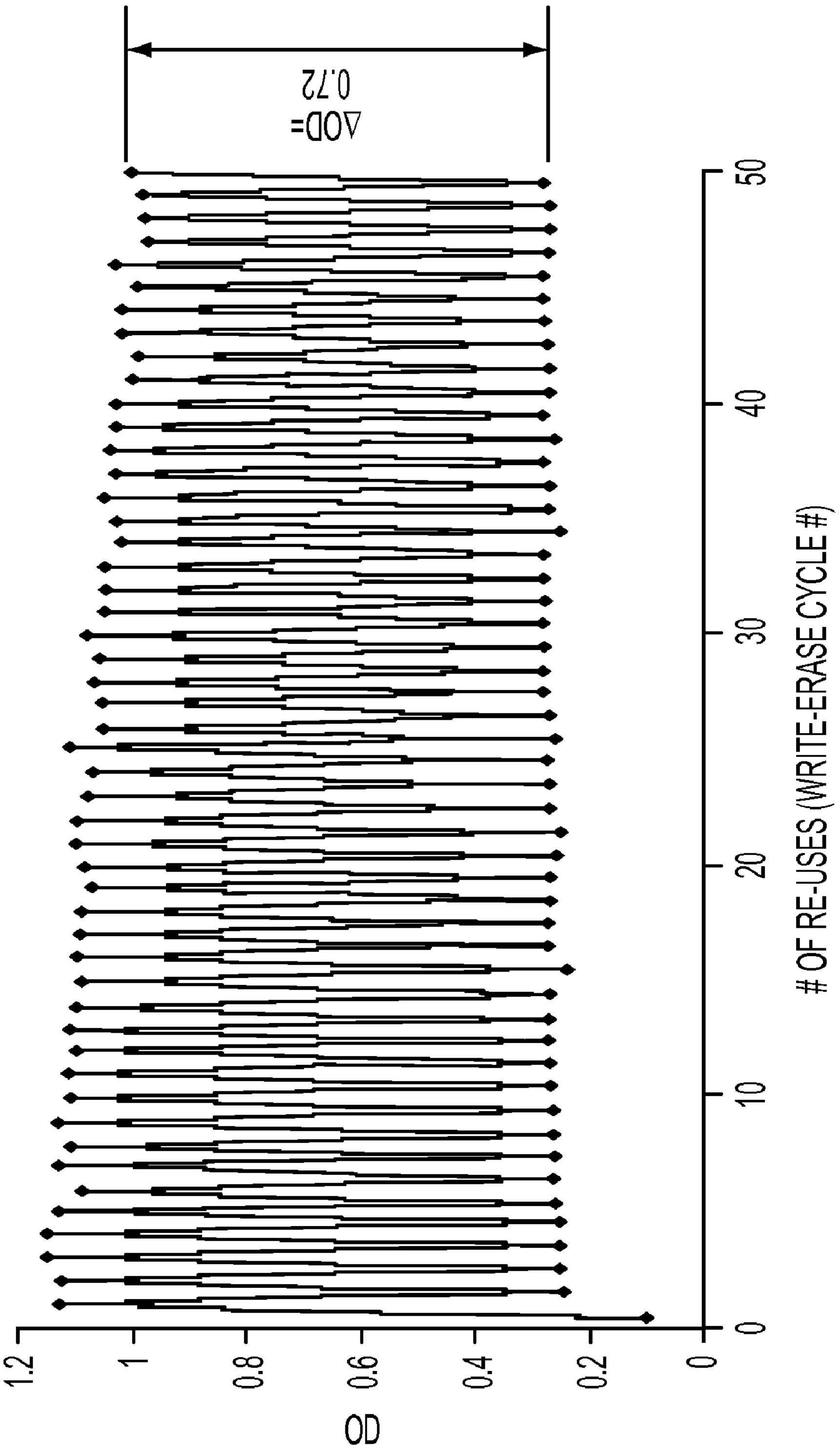
FIG. 4 depicts writing/erasing cycles of an exemplary benchmark erasable paper in accordance with various embodiments of the present teachings.

FIG. 4 depicts experimental results of about 50 cycles of writing/erasing of a benchmark erasable paper. As shown, successive writing and erasing was performed for at least about 50 times, and having an initial image ΔOD of about 0.72 after this 50-cycle of re-usage.

In this particular example, writing was performed by exposing the desired area to an UV light from a 365 nm LED and simultaneously heating at a temperature of 70° C., to provide a written dark state having OD of about 1.1. Erasing was performed by heating the sample at a temperature of about 90° C. without UV light exposure, to provide an OD of about 0.25. This results in significant cost savings for customers.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

What is claimed is:

1. A photochromic composite comprising:

a photochromic polymer comprising a photochromic moiety covalently bound to a backbone portion, wherein the photochromic polymer has a glass transition temperature ranging from about 30° C. to about 150° C.; and a polymer binder, wherein the polymer binder and the backbone portion of the photochromic polymer are similar type polymers, and wherein the polymer binder and the backbone portion each comprises at least one similar functional group, wherein the backbone portion is prepared by polymerizing a monomer mixture, the monomer mixture comprising (a) a first monomer selected from the group consisting of terephthalic acid, dimethyl terephthalate, terephthaloyl chloride, isophthalic acid, dimethyl isophthalate, isophthaloyl chloride, phthalic acid, dimethyl phthalate, phthaloyl chloride, and mixtures thereof, and (b) a second monomer selected from the group consisting of ethylene glycol, propylene glycol, butylene glycol, pentylene glycol, hexylene glycol, heptylene glycol, diethylene glycol, dipropylene glycol, cyclohexyldimethanol, and mixtures thereof.

2. The composite of claim 1, wherein the photochromic moiety of the photochromic polymer is selected from the group consisting of spiropyran, spirooxazine, chromene, spirodihydroindolizine, spiroperimidine, azobenzene, thioindigo, and a moiety having the following formula:

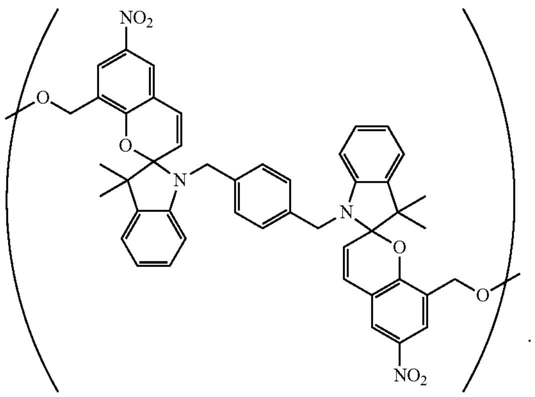

3. A photochromic composite comprising:

a photochromic polymer comprising a block copolymer having the following formula:

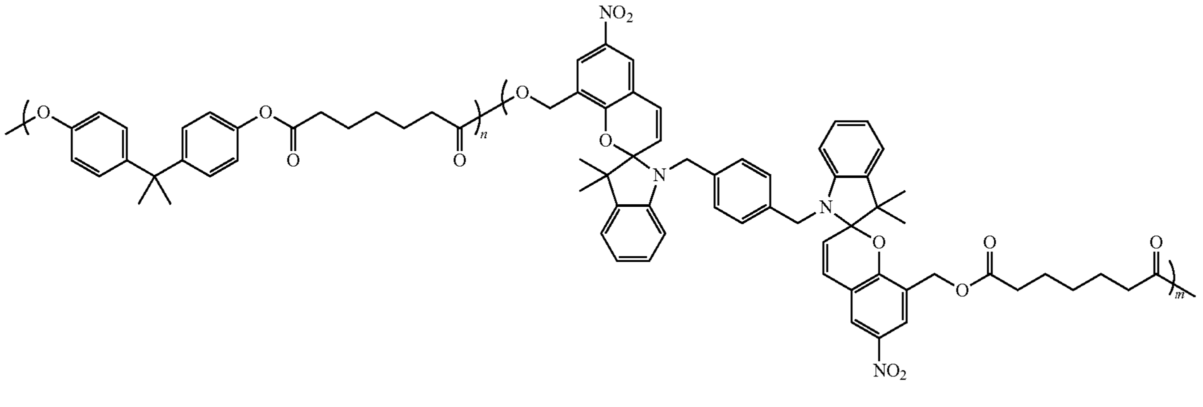

wherein m ranges from about 1 to about 1000, and n ranges from 0 to about 1000, and a polymer binder, wherein the polymer binder and the backbone portion of the photochromic polymer are similar type polymers, and wherein the polymer binder and the backbone portion each comprises at least one similar functional group.

4. An erasable medium comprising the photochromic composite of claim 1 disposed over a substrate, wherein the photochromic polymer of the photochromic composite is imageable.

5. The medium of claim 4, wherein at least a part of the photochromic cormposite converts from a colorless state to a colored state when both a radiant energy and a temperature ranging from about 30° C. to about 100° C. are applied thereto.

6. The medium in claim 5, wherein the radiant energy has a wavelength of from about 200 nm to about 475 nm.

7. The medium of claim 4, wherein the imageable photochromic polymer reverts from a colored state to a colorless state at a temperature of about 70° C. and above.

8. The medium of claim 4, wherein the imageable photochromic polymer etains an image for at least about 24 hours.

9. The medium of claim 4, further comprising a second imageable photochromic composite disposed over the substrate on a side opposite to the photochromic composite, the second imageable photochromic composite comprising the photochromic polymer and the polymer binder.

10. A method for making an erasable medium comprising:

providing a photochromic polymer comprising a photochromic moiety covalently bound to a backbone portion, wherein the photochromic polymer has a glass transition temperature ranging from about 30° C. to about 150° C.;

preparing a composition comprising the photochromic polymer and a polymer binder, wherein the polymer binder is a similar type polymer to the polymer backbone of the photochromic polymer;

applying the composition to a substrate; and drying the applied composition on the substrate to or a photochromic layer, wherein the backbone portion is prepared by polymerizing a monomer mixture the monomer mixture comprising (a) a first monomer selected from the group consisting of terephthalic acid, dimethyl terephthalate, terephthaloyl chloride, isophthalic acid, dimethyl isophthalate, isophthaloyl cloride, phthalic acid, dimethyl phthalate, phthaloyl chloride, and mixtures thereof, and (b) a second monomer selected from the group consisting of ethylene glycol, propylene glycol, butylene glycol, pentylene glycol, hexylene glycol, heptylene glycol, diethylene glycol, dipropylene glycol, cyclohexyldimethanol, and mixtures thereof.

11. The method of claim 10, wherein at least a portion of the photochromic layer converts to a colored state from a colorless state when both a radiant energy and a temperature ranging from about 30° C. to about 100° C. are applied thereto.

12. A method or making an erasable medium comprising:

preparing a composition comprising a photochromic polymer and a polymer binder, wherein the photochromic polymer is a block copolymer having the following formula:

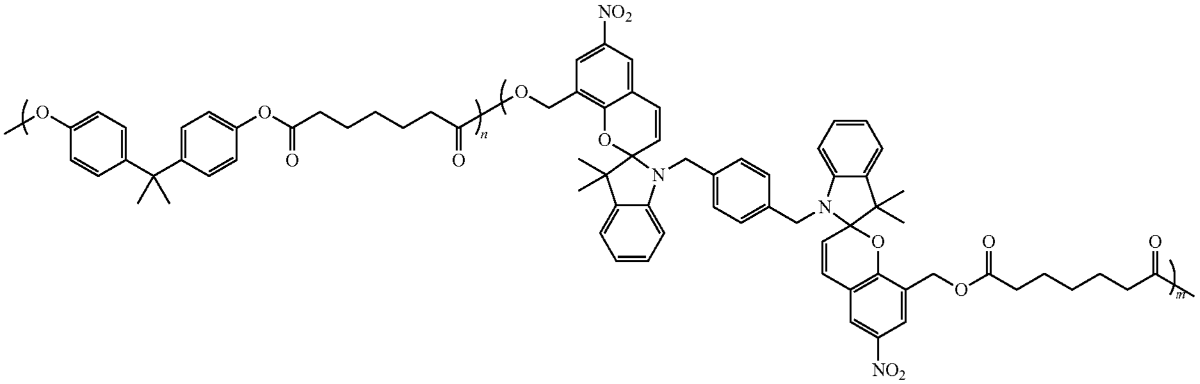

and a polymer binder having the following formula:

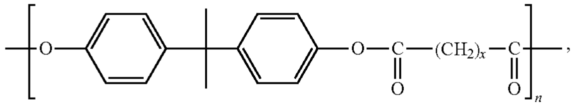

wherein m ranges from about 1 to about 1000, n ranges from 0 to about 1000, and x ranges from 0 to about 10, applying the composition to a substrate; and drying the applied composition on the substrate to form a photochromic layer.

13. The method of claim 10, wherein the substrate is selected from the group consisting of glass, ceramic, wood, plastic, fabric, textile, metal, plain paper, and coated paper.

14. A method of forming an erasable image comprising:

providing an erasable medium comprising:

a substrate, and a photochromic layer disposed on the substrate, wherein the photochromic layer comprises a photochromic polymer dispersed in a polymer binder, and wherein the photochromic polymer comprises a photochromic moiety covalently bound to a backbone portion that is a similar type polymer to the polymer binder, wherein the backbone portion is prepared by polymerizing a monomer mixture, the monomer mixture comprising (a) a first monomer selected from the group consisting of terephthalic acid, dimethyl tereophthalate, terephthaloyl chloride, isophthalic acid, dimethyl isophthalate, isophthaloyl chloride, phthalic acid dimethyl phthalate, phthaloyl chloride, and mixtures thereof and (b) a second monomer selected from the group consisting of ethylene glycol, propylene glycol, butylene glycol, pentylene glycol, hexylene glycol, heptylene glycol, diethylene glycol, dipropylene glycol, cyclohexyldimethanol, and mixtures thereof; and exposing the photochromic layer of the erasable medium to both a radiant energy and a temperature ranging from about 30° C. to about 100° C. to form a visible image on the erasable medium.

15. The method of claim 14, further comprising:

heating the erasable medium bearing the visible image at a temperature of about 70° C. or greater to erase the visible image from the erasable medium; and repeating the step of exposing the erasable medium to both the radiant energy and the temperature at least one additional time.

16. The method of claim 14, wherein the steps of heating the erasable medium and exposing the erasable medium are repeated at least about 10 times.

17. The method of claim 14, wherein the visible image has a lifetime of at least about 3 days.

18. The method of claim 14, wherein the visible image has an initial optical density difference with a background area of about 0.75 or greater.

19. The method of claim 14, wherein, after 3 days from the exposure, the visible image has an optical density difference with a background area of at least about 40% of an initial optical density difference there-between.

* * * * *